United States Patent
Broach et al.

(10) Patent No.: US 6,806,695 B1
(45) Date of Patent: Oct. 19, 2004

(54) APPARATUS AND METHOD FOR EFFICIENCY OPTIMIZATION OF INTEGRATED CIRCUITS BY TEMPERATURE SENSOR AND SERVO LOOP

(75) Inventors: Michael Eugene Broach, San Mateo, CA (US); Barry James Culpepper, Sunnyvale, CA (US)

(73) Assignee: National Semiconductor Corporation, Santa Clara, CA (US)

(*) Notice: Subject to any disclaimer, the term of this patent is extended or adjusted under 35 U.S.C. 154(b) by 29 days.

(21) Appl. No.: 10/404,225

(22) Filed: Mar. 31, 2003

(51) Int. Cl.[7] ............................................... H03K 21/00
(52) U.S. Cl. ...................................................... 323/513
(58) Field of Search .............................. 323/364, 907; 327/512, 513; 365/226, 227

(56) References Cited

U.S. PATENT DOCUMENTS

| | | | | |
|---|---|---|---|---|
| 5,731,735 A | * | 3/1998 | Yokota et al. | ............... 327/535 |
| 6,078,209 A | * | 6/2000 | Linoff | ......................... 327/513 |
| 6,363,029 B1 | * | 3/2002 | Watanabe et al. | ....... 365/230.06 |
| 6,621,303 B2 | * | 9/2003 | Moon | .......................... 326/93 |

* cited by examiner

Primary Examiner—Matthew V. Nguyen
(74) Attorney, Agent, or Firm—Brett A. Hertzberg; Merchant & Gould PC (57) ABSTRACT

Optimization of a parameter can be achieved by a servo loop having a temperature sensor, a temperature change detector, and a parameter adjuster. The temperature sensor monitors the temperature of an electronic device while the parameter is varied. The temperature change detector detects whether the electronic device temperature is increasing or decreasing. The parameter has a value associated with minimum power consumption when the monitored temperature reaches a minimum. The parameter is adjusted dynamically to a new preferred value as operating conditions of the electronic device change.

21 Claims, 7 Drawing Sheets

APPARATUS AND METHOD FOR EFFICIENCY OPTIMIZATION OF INTEGRATED CIRCUITS BY TEMPERATURE SENSOR AND SERVO LOOP

FIELD OF THE INVENTION

The present invention relates to efficiency optimization of integrated circuits, and more particularly to efficiency optimization that can be maintained under changing operating conditions of the integrated circuit by a servo loop.

BACKGROUND OF THE INVENTION

Demand for portable electronic devices is increasing each year. Example portable electronic devices include: laptop computers, personal data assistants (PDAs), cellular telephones, and electronic pagers. Portable electronic devices place high importance on total weight of the device. The overall weight of the portable electronic device may be greatly affected by the battery. Various efforts have been made in technologies such as Lithium-Ion (Li-Ion) to provide smaller battery form factors with reduced overall weight.

The demand for higher speed circuits with smaller form factors is increasing, largely as a result of increases in the need for portable electronic devices. The density of circuits is increasing as a consequence of the need for smaller form factors such that higher power electronic devices are now placed in relatively close proximity to other circuits on a common substrate (e.g., an integrated circuit board). The increased density of the circuits results in increased heat dissipation requirements. Performance, reliability and life expectancy of electronic equipment are inversely related to the component temperature of the equipment.

Most portable electronic devices place a premium on total time of use (e.g., talk time in a cellular telephone). Batteries store a finite amount of charge that is typically rated in units of milliampere-hours (mA-Hr). Charge is depleted from the battery by the electronic device during operation. Since these devices may consume power at a rapid rate, the total time of utility (i.e., the run time of the battery) is greatly affected by power conservation techniques in the electronic device. For example, many laptop computers have power management software to extend the battery life, or conserve battery power when the battery is low. In this example, the software extends the run time of the battery by lowering the internal clock frequency of the computer.

A DC regulator such as a DC—DC controller is often used to control power regulation in a portable electronic device. A typical DC—DC controller is a buck regulator that switches current to an LC filter that provides a DC output voltage to the load. The DC output voltage is determined by the average of the voltage waveform that is delivered to the inductor, which is related to the duty cycle of the switching in the buck regulator. The efficiency of the DC—DC controller is rated in terms of percentage of power that is delivered to the load from the available supply (i.e., $[P_{OUT}/P_{IN}]\times100\%$). A high efficiency DC—DC controller wastes very little power in the regulation process, while a low efficiency DC—DC controller requires more "overhead" that results in wasted power. For portable electronic devices, it is preferred to have high efficiency in the DC regulation process so that the run time of the battery is maximized.

SUMMARY OF THE INVENTION

This summary of the invention section is intended to introduce the reader to aspects of the invention. Particular aspects of the invention are pointed out in other sections herein below, and the invention is set forth in the appended claims, which alone demarcate its scope.

The present invention is directed to an apparatus for optimizing the efficiency of an integrated circuit with respect to at least one operating parameter. The apparatus includes a temperature sensor, a temperature change detector, and a parameter adjuster. The temperature sensor monitors a current temperature that is associated with an electronic device and provides a current temperature signal. The temperature change detector compares the current temperature signal to a previous temperature signal that was associated with the electronic device. The temperature change detector determines a direction for the temperature (e.g., increasing or decreasing). The parameter adjuster is responsive to the temperature change detector and adjusts the parameter such that a preferred operating point the electronic device is located and maintained. The preferred operating point of the electronic device corresponds to a minimum temperature of the electronic device.

In another aspect, the present invention relates to a method for efficiency optimization of an integrated circuit with respect to at least one operating parameter. The method includes steps of: initializing the parameter; monitoring a temperature that is associated with an electronic device; differentiating to determine a direction of change for the temperature; and adjusting the parameter to locate a minimum temperature of the electronic device.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

In the following detailed description of exemplary embodiments of the invention, reference is made to the accompanied drawings, which form a part hereof, and which is shown by way of illustration, specific exemplary embodiments of which the invention may be practiced. Each embodiment is described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification, and in the claims, the term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" refers to at least one current signal, voltage signal, electromagnetic wave signal, charge signal, temperature signal or data signal. The meaning of "a", "an", and "the" include plural references. The meaning of "in" includes "in" and "on".

Briefly stated, the invention is directed to an apparatus and method for efficiency optimization of an integrated circuit. A servo loop locates and maintains an optimal operating point of the integrated circuit using thermal feedback. The optimal operating point corresponds to a minimum temperature value on the integrated circuit. The minimum temperature value on the integrated circuit can be located by varying a control parameter such as the gate charge quantity of a field-effect transistor (FET) power device, measuring the temperature, and servoing the gate charge quantity to a value such that the temperature is minimized. The apparatus and method can be applied to any system implemented in an integrated circuit to optimize efficiency of the integrated circuit. The apparatus and method can be adapted to any parameter of an integrated circuit that has a value associated with minimum power consumption.

Figure 1:
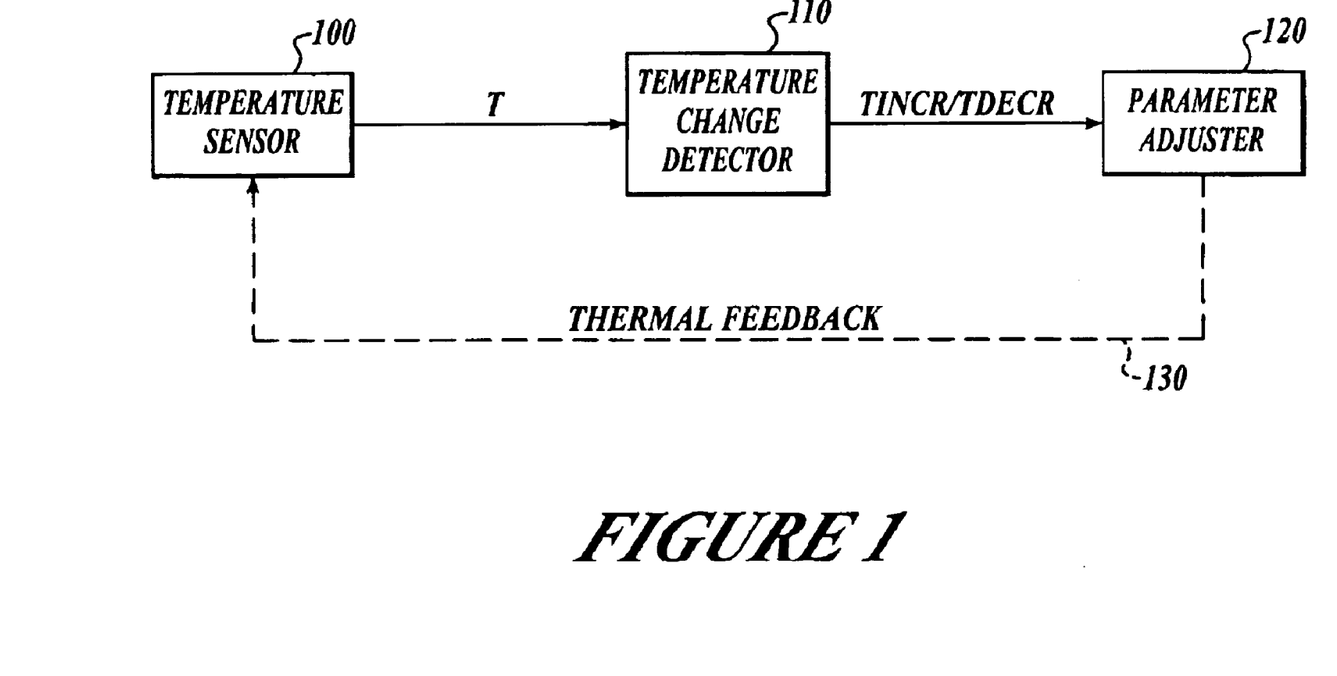
FIG. 1 illustrates a block diagram generally showing an overview of a servo loop for efficiency optimization of an integrated circuit in accordance with the present invention.

A block diagram generally showing an overview of a servo loop for efficiency optimization of an integrated circuit is shown in FIG. 1. The servo loop includes a temperature sensor (100), a temperature change detector (110), and a parameter adjuster (120). Temperature sensor 100 is coupled to temperature change detector 110. Temperature change detector 110 is coupled to parameter adjuster 120. Parameter adjuster 120 is coupled to temperature sensor 100 via a thermal feedback loop 130.

Temperature sensor 100 detects an integrated circuit temperature (T). Temperature change detector 110 outputs either a temperature increasing signal (TINCR) when integrated circuit temperature T is greater than a previously detected temperature, or a temperature decreasing signal (TDECR) when integrated circuit temperature T is less than the previously detected temperature. Parameter adjuster 120 is responsive to the temperature increasing and decreasing signals (TINCR/TDECR). Parameter adjuster 120 varies a parameter associated with the integrated circuit to locate the optimal parameter value corresponding to a minimum temperature (e.g., minimum power consumption) of the integrated circuit. Integrated circuit temperature T is maintained at the minimum obtainable value regardless of variations in the ambient temperature or operating conditions.

Temperature sensor 100 may be any sensor that is designed to monitor temperature. For example, temperature sensor 100 can be a temperature dependent voltage with a constant slope, a temperature dependent current source (such as a proportional to absolute temperature (PTAT) current generator), and/or a diode. In one embodiment, the temperature dependent voltage, such as from a $\Delta V_{BE}$ generator, can be amplified to provide a sufficient dynamic range to give an acceptable signal-to-noise ratio. In one embodiment of the invention, more than one temperature sensor may be utilized. For example, a complex system may incorporate several power devices in one integrated circuit where each power device has a corresponding temperature sensor.

Temperature sensor 100 may be either implemented on the integrated circuit or external to the integrated circuit. In one embodiment, a power device in a direct current chopper is typically external to a controller, which may be implemented on an integrated circuit. For this embodiment, temperature sensor 100 is external and is located in relatively close proximity to the power device.

In one embodiment, temperature sensor 100 monitors a temperature associated with an electronic device. For example, the electronic device can be a power device, a power amplifier, a linear regulator, an audio amplifier, and/or a FET. The electronic device may be either implemented on the integrated circuit or external to the integrated circuit.

Any parameter associated with the integrated circuit that provides some minimum temperature value may be optimized. Example parameters include: the gate charge quantity delivered to a FET, the dead time interval between switches of a half-bridge, and clock frequency. In one embodiment of the invention, the parameter is adjusted dynamically to any new optimal value as integrated circuit operating conditions change. The dynamic adjustment may be made continuously, periodically, and/or on demand. For example, the parameter may be adjusted in response to temperature sensed load or supply voltage variations.

The servo loop locates the preferred operating point for the control parameter. The preferred operating point corresponds to the zero value of the differentiated temperature function (T) monitored by thermal sensor 120 with respect to the control parameter (x), i.e., the partial derivative of the sensed temperature with respect to the control parameter ($\partial T(x)/\partial x=0$).

Figure 2:
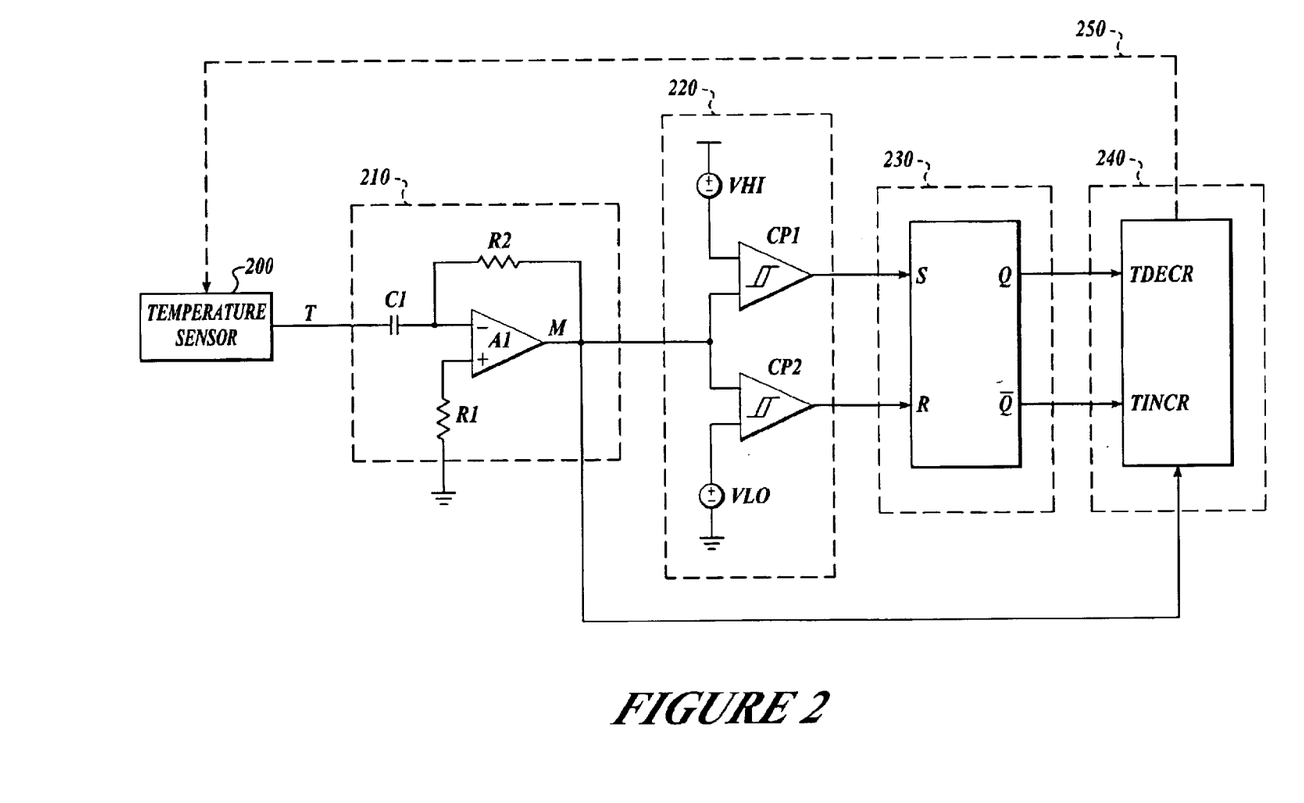
FIG. 2 illustrates a schematic diagram for a continuous time analog solution for efficiency optimization of an integrated circuit.

A schematic diagram of a continuous time analog solution for efficiency optimization of an integrated circuit is illustrated in FIG. 2. The analog solution includes a temperature sensor (200), a differentiator circuit (210), a window comparator (220), a direction latch (230) shown in the figure as a flip-flop circuit, and a parameter adjuster (240). Temperature sensor 200 provides a temperature signal (T) to differentiator circuit 210. Differentiator circuit 210 provides a signal (M) to window comparator 220 and to parameter adjuster 240. Window comparator 220 provides set/reset signals (S/R) to direction latch 230. Direction latch 230 provides temperature increasing/decreasing signals (TINCR/TDECR) to parameter adjuster 240. Parameter adjuster 240 is coupled to temperature sensor 200 via thermal feedback (250).

An example differentiator circuit 210 includes a capacitor (C1), two resistors (R1, R2), and an amplifier (A1). Capacitor C1 is coupled between temperature sensor 200 and the inverting input of amplifier A1. Resistor R1 is coupled to the non-inverting input of amplifier A1. Resistor R2 is coupled between the inverting input and the output of amplifier A1. The output of amplifier A1 is coupled to window comparator 220 and parameter adjuster 240.

Window comparator 220 comprises two hysteretic comparators (CP1, CP2). One input of comparator CP1 is coupled to a high reference voltage ($V_{HI}$). The other input of comparator CP1 is coupled to the output of amplifier A1. One input of comparator CP2 is coupled to a low reference voltage ($V_{LO}$). The other input of comparator CP2 is coupled to the output of amplifier A1. The output of comparator CP1 provides set signal S to direction latch 230. The output of comparator CP2 provides reset signal R to direction latch 230.

In operation, temperature sensor 200 monitors the current temperature of the integrated circuit and provides temperature signal T to differentiator circuit 210. In one example, temperature sensor 200 is a $\Delta V_{BE}$ based temperature sensor that provides a temperature measurement signal that is proportional to absolute temperature (e.g., $V_{SNS}=Av \cdot (kT/q) \cdot \ln(10)$; where Av is the gain of amplifier A1). Differentiator circuit 210 is responsive to temperature signal T and provides signal M to window comparator 220 and parameter adjuster 240. Magnitude signal M has a DC level corresponding to the rate of change of temperature signal T. Signal M has a value above a midpoint when the current temperature is increasing such that comparator CP1 activates set signal S. Signal M has a value below a midpoint when the current temperature is decreasing such that comparator CP2 activates reset signal R. The arrangement of window comparator 220 ensures that the set and reset signals (S/R) are not simultaneously active and that the system is relatively insensitive to noise.

Direction latch 230 stores data about the direction of the change in the temperature sensed by temperature sensor 200 as increasing or decreasing. Direction latch 230 provides a temperature increasing signal (TINCR) to parameter adjuster 240 when signal M is larger than low reference voltage $V_{LO}$. Direction latch 230 provides a temperature decreasing signal (TDECR) to parameter adjuster 240 when signal M is less than high reference voltage $V_{HI}$. Parameter adjuster 240 may utilize signal M and the temperature increasing and decreasing signals (TINCR/TDECR) to determine how much to adjust the parameter such that a minimum operating temperature is quickly achieved (e.g., the greater the magnitude of signal M the faster the parameter adjustment should be made.)

Figure 3:
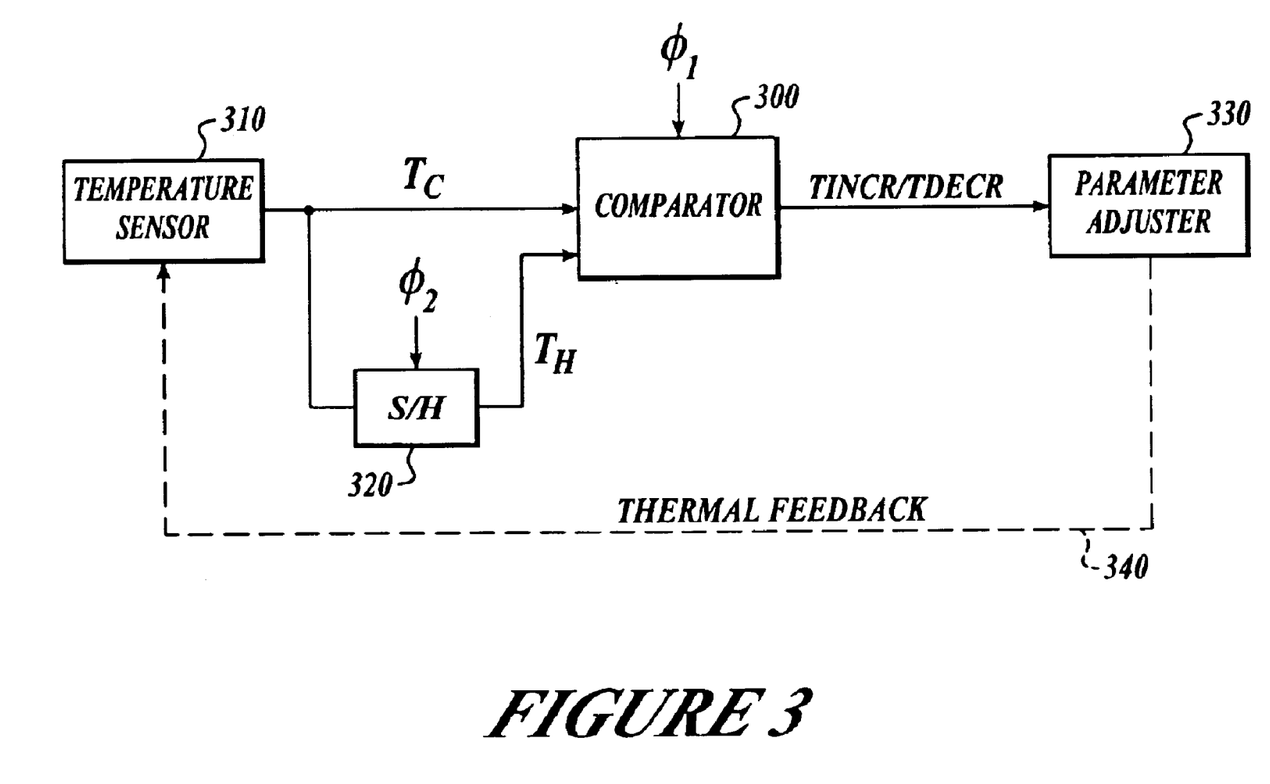
FIG. 3 illustrates a block diagram of one embodiment of a servo loop for efficiency optimization of an integrated circuit.

A block diagram of one embodiment of a servo loop for integrated circuit efficiency optimization is shown in FIG. 3. A comparator (300) is responsive to output signals from a temperature sensor (310) and a sample/hold device (320). The output signal of temperature sensor 310 is also provided to sample/hold device 320. A parameter adjuster (330) is responsive to an output from comparator 310. Parameter adjuster 330 is coupled to temperature sensor 310 via a thermal feedback (340).

Temperature sensor 310 detects the temperature of the integrated circuit and provides a current temperature signal ($T_C$). Sample/hold device 320 samples the current temperature signal ($T_C$) and provides a temperature delay signal ($T_H$) that is a temperature that was previously detected by temperature sensor 310. Comparator 300 compares current temperature signal $T_C$ to temperature delay signal $T_H$. Comparator 300 activates at a first event ($\emptyset_1$) and sample/hold device 320 actives at a second event ($\emptyset_2$), where first event $\emptyset_1$ occurs before second event $\emptyset_2$. Comparator 300 provides a temperature increasing signal (TINCR) when the value of current temperature signal $T_C$ is greater than temperature delay signal $T_H$. Comparator 300 provides a temperature decreasing signal (TDECR) when the value of current temperature signal $T_C$ is less than temperature delay signal $T_H$. Parameter adjuster 330 reverses direction when the temperature increasing signal (TINCR) is detected. Parameter adjuster 330 varies the parameter in response to the output of comparator 300 (i.e., the TINCR and TDECR signals) such that the temperature of the integrated circuit approaches a minimum temperature.

Figure 4:
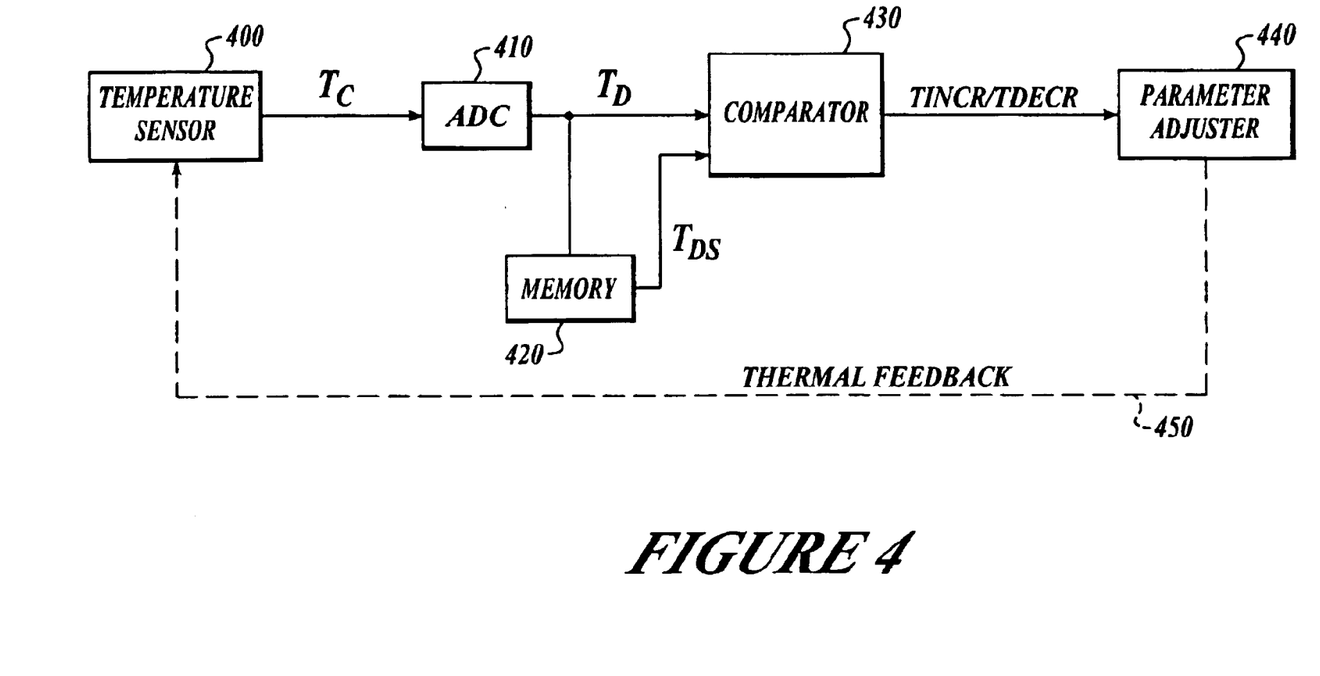
FIG. 4 illustrates a block diagram of a digitally-implemented embodiment of a servo loop for efficiency optimization of an integrated circuit.

A block diagram of a digitally-implemented embodiment of a servo loop for efficiency optimization of an integrated circuit is illustrated in FIG. 4. A temperature sensor (400) is coupled to an analog-to-digital converter (ADC, 410). The output of ADC 410 is coupled to a memory (420). A comparator (430) receives the output of ADC 410 and the output of memory 420, and provides an output that is coupled to a parameter adjuster (440). Comparator 430 is coupled to temperature sensor 400 via thermal feedback 450.

Temperature sensor 400 detects a current temperature ($T_C$) of the integrated circuit. ADC 410 converts current temperature $T_C$ into a digital temperature signal ($T_D$). Digital temperature signal $T_D$ is stored in memory 420. Memory 420 provides a previously stored temperature ($T_{DS}$). Comparator 430 compares digital temperature signal $T_D$ to previously stored temperature $T_{DS}$. Comparator 430 provides a temperature increasing signal (TINCR) when the digital temperature signal $T_D$ is greater than the previously stored temperature $T_{DS}$. Comparator 430 provides a temperature decreasing signal (TDECR) when the digital temperature signal $T_D$ is less than the previously stored temperature $T_{DS}$. Parameter adjuster 440 reverses direction when the temperature increasing signal (TINCR) is detected. Parameter adjuster 440 varies the parameter in response to the temperature increasing and decreasing signals (TINCR/TDECR) provided by comparator 430 such that the temperature of the integrated circuit approaches a minimum temperature.

Figure 5:
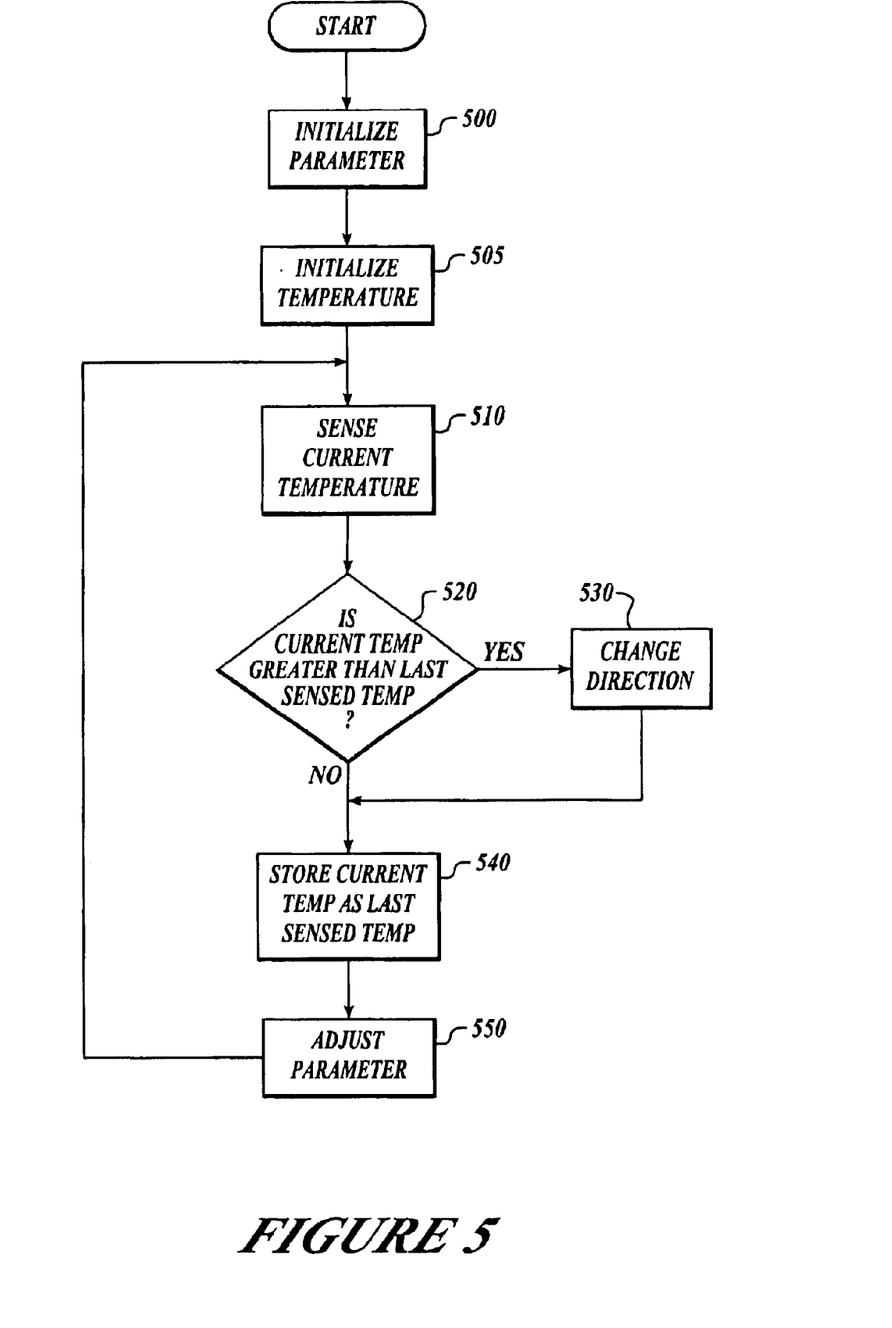
FIG. 5 illustrates a functional block diagram generally showing a method for efficiency optimization of an integrated circuit.

A functional block diagram generally showing a method for efficiency optimization of an integrated circuit by a servo loop is illustrated in FIG. 5. After a start block, the process moves to block 500 where the parameter is set to an initial value. Transitioning to block 505, the temperature of the integrated circuit is initialized. Moving to block 510, the temperature of the integrated circuit is monitored by the temperature sensor. According to one embodiment the temperature is monitored over a period of a few hundred microseconds. Flowing to block 520, an inquiry is made into whether the current temperature of the integrated circuit is greater than a last temperature of the integrated circuit monitored by the temperature sensor. The process moves from block 520 to block 530 when the current temperature is greater than the last sensed temperature. The process flows from block 520 to block 540 when the current temperature is less than the last sensed temperature. At block 530, the direction of parameter variance (e.g., increasing or decreasing) is changed. Transitioning to block 540, the current temperature monitored by the temperature sensor is stored as the last sensed temperature. Moving to block 550, the parameter is adjusted (e.g., incremented or decremented according to the selected direction of parameter variance). Process control then transfers to block 510.

Figure 6:
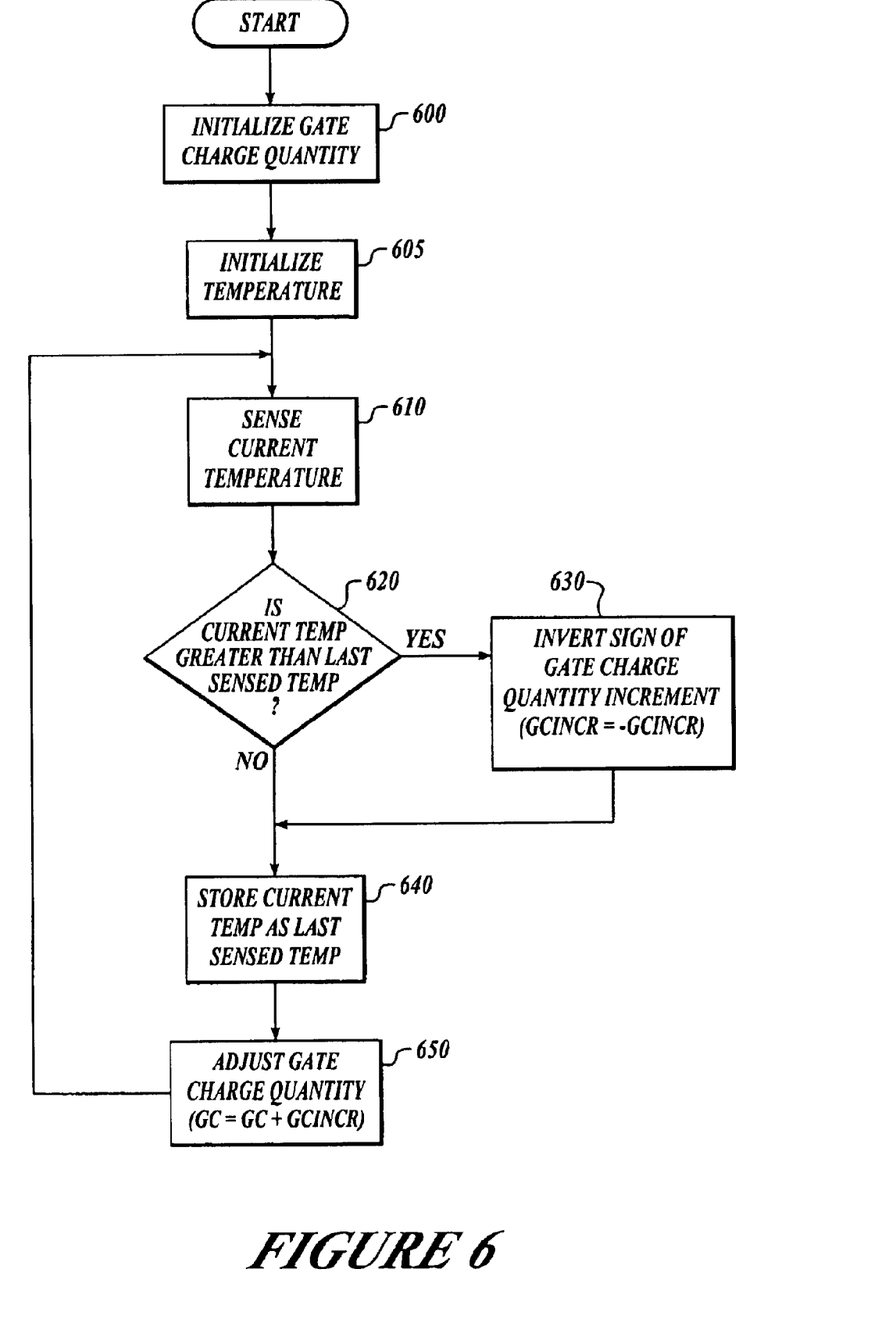
FIG. 6 illustrates a functional block diagram showing a method for efficiency optimization of a gate charge quantity for a power device.

A functional block diagram showing a method for efficiency optimization of a gate charge quantity for a power device is illustrated in FIG. 6. After a start block, the process moves to block 600 where the gate charge quantity is set to an initial value. Transitioning to block 605, the temperature of the integrated circuit is initialized. Moving to block 610, the temperature of the integrated circuit is monitored by the temperature sensor. Flowing to block 620, an inquiry is made into whether the current temperature of the integrated circuit is greater than a last temperature of the integrated circuit monitored by the temperature sensor. The process moves from block 620 to block 630 when the current temperature is greater than the last sensed temperature. The process moves from block 620 to block 640 when the current temperature is less than the last sensed temperature.

At block 630, the sign of gate charge quantity increment (gcincr) is inverted (e.g., gcincr=−gcincr). Transitioning to block 640, the current temperature monitored by the temperature sensor is stored as the last sensed temperature (e.g., $T_H=T_C$ or $T_{DS}=T_D$). Moving to block 650, the gate charge quantity (gc) is adjusted, i.e., the gate charge is incremented or decremented according to the sign of the gate charge quantity increment (e.g., gc=gc+gcincr). Process control then transfers from block 650 to block 610.

Figure 7:
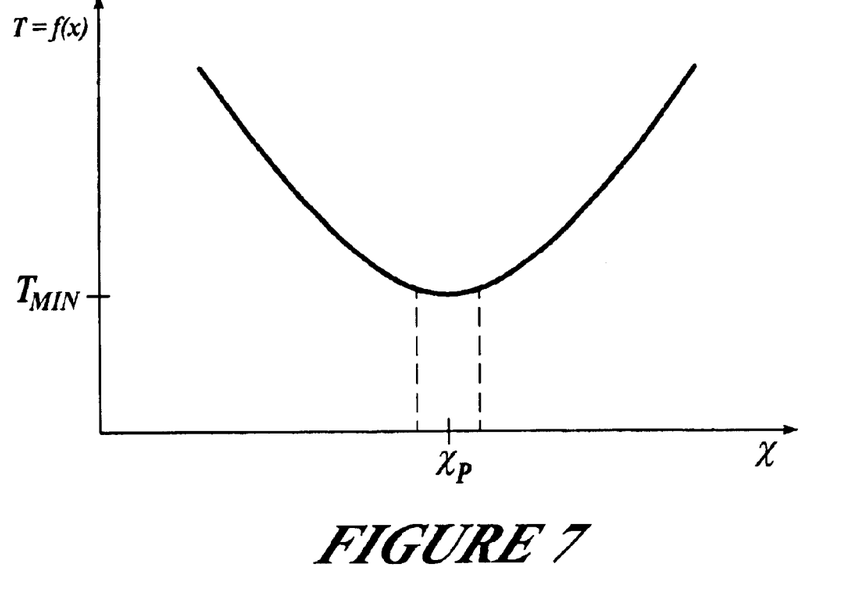
FIG. 7 illustrates a graph showing a function of integrated circuit temperature with respect to a control parameter.

FIG. 7 illustrates a graph showing a function of the integrated circuit temperature (T) with respect to a parameter (x) of the integrated circuit. The function of integrated circuit temperature T with respect to the varying parameter (x) is shaped like a parabola having a minimum value ($T_{MIN}$) for integrated circuit temperature T. As the parameter (x) is varied the value of integrated circuit temperature T also changes. Integrated circuit temperature T approaches $T_{MIN}$ as long as the current temperature sensed by the temperature sensor is less than the last sensed temperature. The parameter is varied in the opposite direction when the current temperature sensed by the temperature sensor is greater than the last sensed temperature. The control scheme results in the parameter (x) that is substantially about the optimal operating point ($x_p$) within a dither window (indicated by dotted lines in the figure). The dither window allows for sliding mode control of the parameter (x) within an acceptable range for minimal temperature performance.

Figure 8:
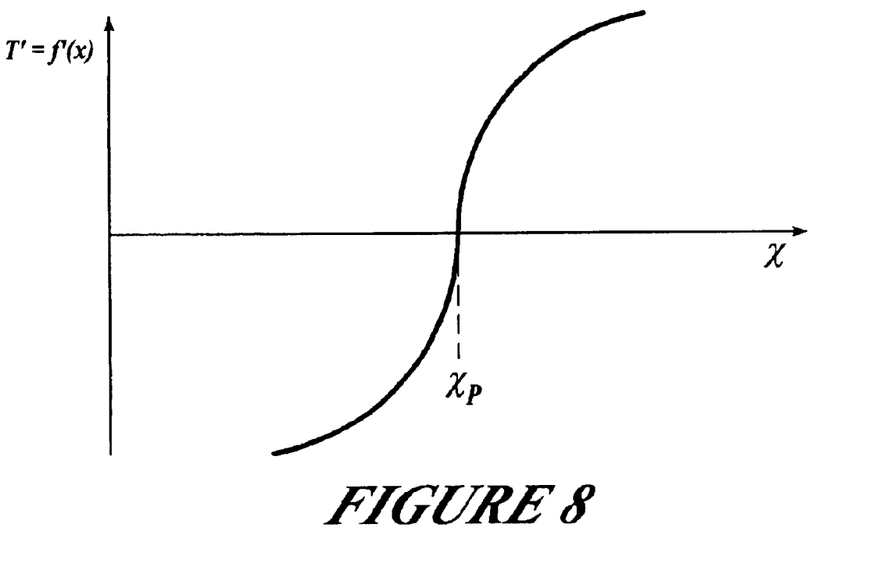
FIG. 8 illustrates a graph showing a differential function of integrated circuit temperature with respect to the control parameter.

FIG. 8 illustrates a graph showing a differential function of integrated circuit temperature (T') with respect to the parameter (x). The optimal operating point ($x_p$) of the integrated circuit is at the zero value of the first derivative of the temperature function (T'=0) with respect to varying parameter x.

The method for efficiency optimization of an integrated circuit improves the performance characteristics of an integrated circuit having a high-power device. The present invention allows an integrated circuit to operate efficiently at higher frequencies and at loads less than maximum. The gate charge quantity delivered to a FET power device (or devices) can be varied. At a light load, the gate of the power device of the integrated circuit may be activated by applying less charge to the gate. At a heavy load, the gate of the power device of the integrated circuit may be activated by applying more charge to the gate. The present invention optimizes the efficiency of the system regardless of the load variance.

The above specification, examples, and data provide a complete description of the manufacture and use of the composition of the invention. Since many embodiments of the invention can be made without departing from the spirit and scope of the invention, the invention resides in the claims hereinafter appended.

We claim:

1. An apparatus for optimizing the efficiency of an integrated circuit with respect to at least one operating parameter, comprising:
   a temperature sensor that is arranged to monitor a current temperature that is associated with an electronic device, and provide a current temperature signal;
   a temperature change detector that is arranged to compare the current temperature signal to a previous temperature signal that was associated with the electronic device, wherein the temperature change detector determines a direction for the temperature, wherein the direction is one of increasing or decreasing; and
   a parameter adjuster that is responsive to the temperature change detector and that is arranged to adjust the parameter such that a preferred operating point of the electronic device is located and maintained, whereby a minimum temperature of the electronic device is obtained.

2. The apparatus of claim 1, wherein the preferred operating point of the integrated circuit corresponds to a minimum temperature value of the integrated circuit.

3. The apparatus of claim 1, wherein the electronic device is implemented in the integrated circuit.

4. The apparatus of claim 1, wherein the electronic device is one of a power device, a power amplification device, a linear regulator, and an audio amplifier.

5. The apparatus of claim 1, wherein the electronic device is a field effect transistor, and wherein the parameter adjuster is arranged to adjust a gate charge quantity of a field effect transistor.

6. The apparatus of claim 1, wherein the parameter is adjusted dynamically to a new preferred value as operating conditions of the electronic device change.

7. The apparatus of claim 1, wherein the temperature change detector includes a comparator.

8. The apparatus of claim 1, wherein the temperature change detector includes a differentiator circuit that is arranged to receive the temperature signal, a window comparator, and a direction latch.

9. The apparatus of claim 1, further comprising an analog-to-digital converter that is coupled between the temperature sensor and the temperature change detector and that is arranged to output a digital temperature signal to the temperature change detector.

10. The apparatus of claim 1, wherein the temperature sensor is at least one of a temperature dependent voltage, a temperature dependent current source, a transistor, and a diode.

11. The apparatus of claim 1, wherein the temperature sensor is implemented on at least one of external to the integrated circuit and within the integrated circuit.

12. A method for efficiency optimization of an integrated circuit with respect to at least one operating parameter, comprising:
   initializing the parameter;
   monitoring a temperature that is associated with an electronic device;
   differentiating to determine a direction of change for the temperature; and
   adjusting the parameter to locate a minimum temperature of the electronic device.

13. The method of claim 12, wherein differentiating comprises comparing the temperature to a previous temperature.

14. The method of claim 12, wherein differentiating comprises differentiating the temperature, setting a direction latch when the differentiated temperature is increasing, and resetting the direction latch when the differentiated signal is decreasing.

15. The method of claim 12, wherein differentiating comprises converting the temperature to a current digital temperature signal, retrieving a previous digital temperature signal from memory, and comparing the current digital temperature signal to the previous temperature digital signal.

16. The method of claim 15, further comprising storing the current digital temperature in memory.

17. The method of claim 12, wherein adjusting the parameter further comprises dynamically adjusting the parameter to a new preferred value as operating conditions of the electronic device change.

18. An apparatus for optimizing the efficiency of an integrated circuit with respect to at least one operating parameter, comprising:
- a means for monitoring the temperature that is associated with an electronic device;
- a means for determining the direction of change for the temperature; and
- a means for adjusting the parameter to locate a minimum temperature of the electronic device.

19. The apparatus of claim 18, further comprising a means for determining a magnitude of change in the temperature, wherein the means for adjusting is arranged to adjust the parameter according to the magnitude of change.

20. The apparatus of claim 18, wherein the means for determining includes a means for comparing a previous temperature to a current temperature, and a means for storing the current temperature as the previous temperature.

21. The apparatus of claim 18, wherein the means for determining includes a means for converting a current temperature to a digital quantity, and a means for comparing the digital quantity to a previously stored digital quantity.

* * * * *